(12) United States Patent
Tseng et al.

(10) Patent No.: US 8,276,033 B2
(45) Date of Patent: Sep. 25, 2012

(54) DATA WRITING METHOD FOR A FLASH MEMORY, AND FLASH MEMORY CONTROLLER AND FLASH MEMORY STORAGE APPARATUS USING THE SAME

(75) Inventors: Chien-Fu Tseng, Yunlin County (TW);
Yu-Hung Liu, Hsinchu County (TW);
Li-Chun Liang, Kaohsiung (TW);
Chih-Kang Yeh, Kinmen County (TW)

(73) Assignee: Phison Electronics Corp., Miaoli (TW)

( * ) Notice: Subject to any disclaimer, the term of this patent is extended or adjusted under 35 U.S.C. 154(b) by 331 days.

(21) Appl. No.: 12/705,307

(22) Filed: Feb. 12, 2010

(65) Prior Publication Data
US 2011/0154162 A1    Jun. 23, 2011

(30) Foreign Application Priority Data
Dec. 23, 2009   (TW) .............................. 98144540 A

(51) Int. Cl.
*G06F 11/00* (2006.01)
*G06F 11/30* (2006.01)
*G08C 25/00* (2006.01)
*H03M 13/00* (2006.01)
*H04L 1/00* (2006.01)
*G11C 29/00* (2006.01)

(52) U.S. Cl. ........................................ 714/746; 714/763

(58) Field of Classification Search .................. None
See application file for complete search history.

(56) References Cited

U.S. PATENT DOCUMENTS

| | | | |
|---|---|---|---|
| 5,287,478 A * | 2/1994 | Johnston et al. | 711/111 |
| 7,589,997 B2 * | 9/2009 | Honma et al. | 365/185.03 |
| 2006/0062048 A1 * | 3/2006 | Gonzalez et al. | 365/185.11 |
| 2007/0101237 A1 * | 5/2007 | Tamura et al. | 714/763 |
| 2011/0185225 A1 * | 7/2011 | Tsuji | 714/6.11 |

* cited by examiner

*Primary Examiner* — Guerrier Merant
(74) *Attorney, Agent, or Firm* — J.C. Patents

(57) ABSTRACT

A data writing method for a flash memory, and a flash memory controller and a flash memory storage apparatus using the same are provided. First, data is received from a host system. Next, the data is divided into at least one frame. Afterwards, an error checking and correcting (ECC) code corresponding to the frame is generated so as to form at least one ECC frame. Then, the ECC frame is divided into a plurality of frame segments. Finally, the frame segments are written into a flash memory chip according to a non-sequentially ranking order.

26 Claims, 8 Drawing Sheets

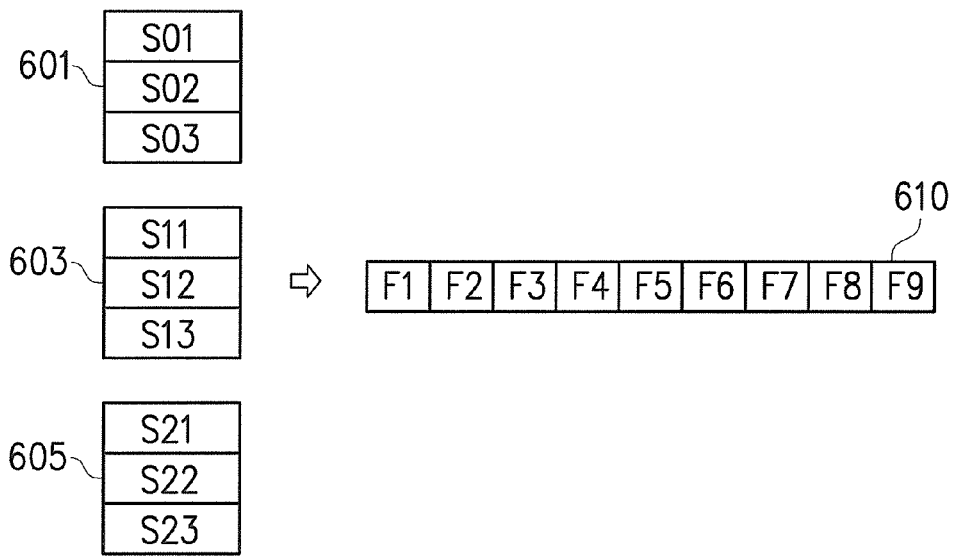
FIG. 6
| Word line zone | F1 | F2 | F3 | F4 | F5 | F6 | F7 | F8 | F9 |
|---|---|---|---|---|---|---|---|---|---|
| The number of error bits | 10 | 9 | 3 | 0 | 0 | 1 | 2 | 4 | 8 |
FIG. 7
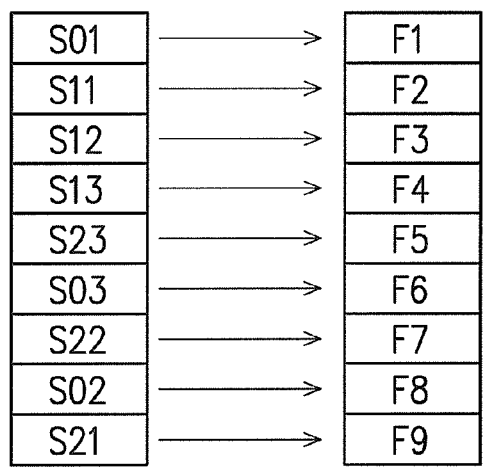
FIG. 8

| Word line zone | F1 | F2 | F3 | F4 | F5 | F6 | F7 | F8 | F9 |
|---|---|---|---|---|---|---|---|---|---|
| The number of error bits | 10 | 9 | 6 | 5 | 0 | 1 | 2 | 4 | 8 |
FIG. 9
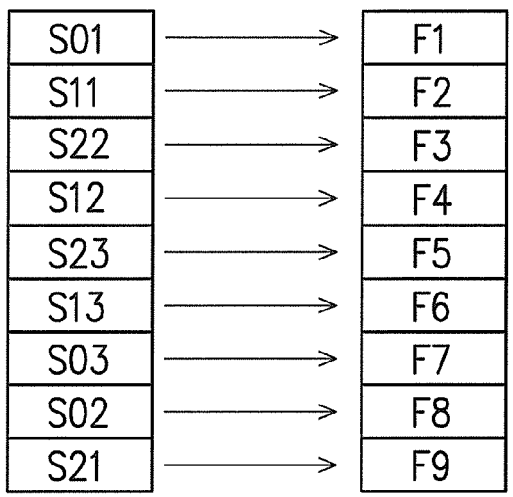
FIG. 10
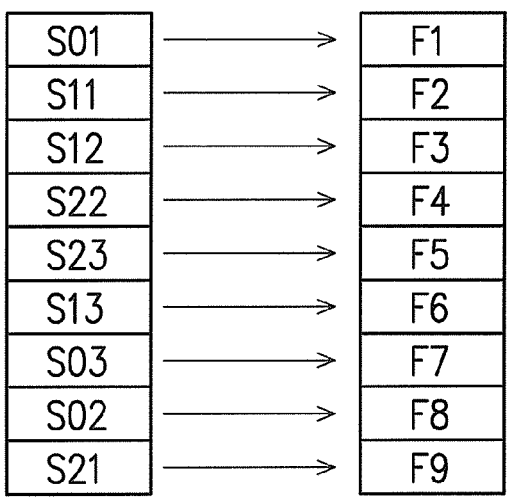
FIG. 11

DATA WRITING METHOD FOR A FLASH MEMORY, AND FLASH MEMORY CONTROLLER AND FLASH MEMORY STORAGE APPARATUS USING THE SAME

CROSS-REFERENCE TO RELATED APPLICATION

This application claims the priority benefit of Taiwan application serial no. 98144540, filed on Dec. 23, 2009. The entirety of the above-mentioned patent application is hereby incorporated by reference herein and made a part of this specification.

BACKGROUND

1. Technology Field

The present invention relates to a data writing method for a flash memory and particularly to a data writing method capable of dispersedly writing data into a flash memory, and a flash memory controller and a flash memory storage apparatus using the method.

2. Description of Related Art

The growth of digital cameras, mobile phones, and MP3 players has been rapid in recent years. Consequently, demands of consumers for storage media of digital contents have increased tremendously. Since a flash memory has characteristics of non-volatile data, energy saving, compact size, and without mechanical construction, the flash memory is suitable for users to carry on bodies as the storage media for transferring and exchanging the digital contents. Solid State Drive (SSD) is an example of utilizing the flash memory as the storage media, and has been widely applied in the computer host as a main hard disk.

The flash memory has a plurality of physical blocks, each of the physical blocks has a plurality of pages, and each page is the minimum unit for being written data in or being read data from. Each of the pages usually includes a user data area and a redundancy area. The user data area is for storing the data of a user, and the redundancy area is for storing system data (e.g. an error checking and a correcting code (ECC code)).

In particular, different zones in a high-density flash memory have different reliability due to its non-uniform manufacturing process. Along with the increase of the usage time and the number of writing/reading times of the high-density flash memory, error bits occurring on data stored in the flash memory have become more. When one ECC code is stored in a lower reliability zone of the high-density flash memory, the situation where data having error bits can not be corrected may occur early, such that a minimum management unit of the flash memory containing the zone can not be used any more. Along with the increase of the capacity of a flash memory, the capacity of the minimum management unit for the flash memory has become more. However, the space for storing one ECC code may occupy 0.1 percentage of the capacity of the minimum management unit. When one of ECC codes can not be used for correcting data, the minimum management unit storing the ECC code would not be used again, and therefore 99.9 percentage of the capacity of the minimum management unit will be wasted.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention relates to a data writing method for a flash memory, and a flash memory controller and a flash memory storage apparatus using the same, which are capable of dispersedly writing data into a flash memory chip, thereby prolonging the lifespan of the flash memory chip.

According to an exemplary embodiment of the present invention, a flash memory storage apparatus for storing data from a host system is provided. The flash memory storage apparatus comprises a connector, a flash memory chip and a flash memory controller. Herein the connector is configured to couple to the host system and receive data from the host system. The flash memory controller is coupled to the flash memory chip and the connector, and configured for dividing the data into at least one frame, generating an ECC code corresponding to the frame, forming an ECC frame according to the frame and the ECC code, dividing the ECC frame into a plurality of frame segments, and ranking the frame segments in a non-sequential ranking order and writing the ranked frame segments into the flash memory chip.

According to an exemplary embodiment of the present invention, a flash memory controller for writing data from a host system into a flash memory chip is provided. The flash memory controller includes a microprocessor unit, a flash memory interface unit, a host interface unit, an error checking and correcting (ECC) unit and a memory management unit. The flash memory interface unit is coupled to the microprocessor unit for coupling to the flash memory chip. The host interface unit is coupled to the microprocessor unit and configured for coupling to the host system and receiving data from the host system. The memory management unit is coupled to the microprocessor unit for writing the data into the flash memory chip. The ECC unit is coupled to the microprocessor unit and configured to generating an ECC code for the data. Herein the memory management unit divides the data into at least one frame, the ECC unit generates an ECC code corresponding to the at least one frame, the memory management unit forms an ECC frame according to the frame and the ECC code. Additionally, the memory management unit divides the ECC frame into a plurality of frame segments, ranks the frame segments in a non-sequentially ranking order and writes the ranked frame segments into the flash memory chip.

A data writing method for writing data from a host system into a flash memory chip is provided. First, data is received from a host system. The data writing method also includes dividing the data into at least one frame. The data writing method still includes generating an ECC code corresponding to the frame, and forming at least one ECC frame according to the frame and the ECC code corresponding to the frame. The data writing method also includes dividing the ECC frame into a plurality of frame segments. The data writing method further includes writing the frame segments into the flash memory chip in a non-sequentially ranking order.

As described above, the exemplary embodiments are capable of dispersedly writing frame segments corresponding each ECC frame into different zones, thereby preventing frame segments belonging to the same ECC frame from being written into adjacent addresses and preventing the situation where data having error bits can not be corrected from occurring. Accordingly, the effect of the non-uniform manufacturing process is eliminated and the lifespan of the flash memory storage apparatus is prolonged.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6 is a diagram illustrating ECC frames and a word line according to an exemplary embodiment of the present invention.

FIG. 7 is a diagram illustrating word line zones and the number of error bits according to an exemplary embodiment of the present invention.

FIG. 8 is a diagram illustrating a ranking order table according to one exemplary embodiment of the present invention.

FIG. 9 is a diagram illustrating word line zones and the number of error bits according to another exemplary embodiment of the present invention.

FIG. 10 is a diagram illustrating a ranking order table according to another exemplary embodiment of the present invention.

FIG. 11 is a diagram illustrating a ranking order table according to another exemplary embodiment of the present invention.

DESCRIPTION OF EMBODIMENTS

Figure 1A:
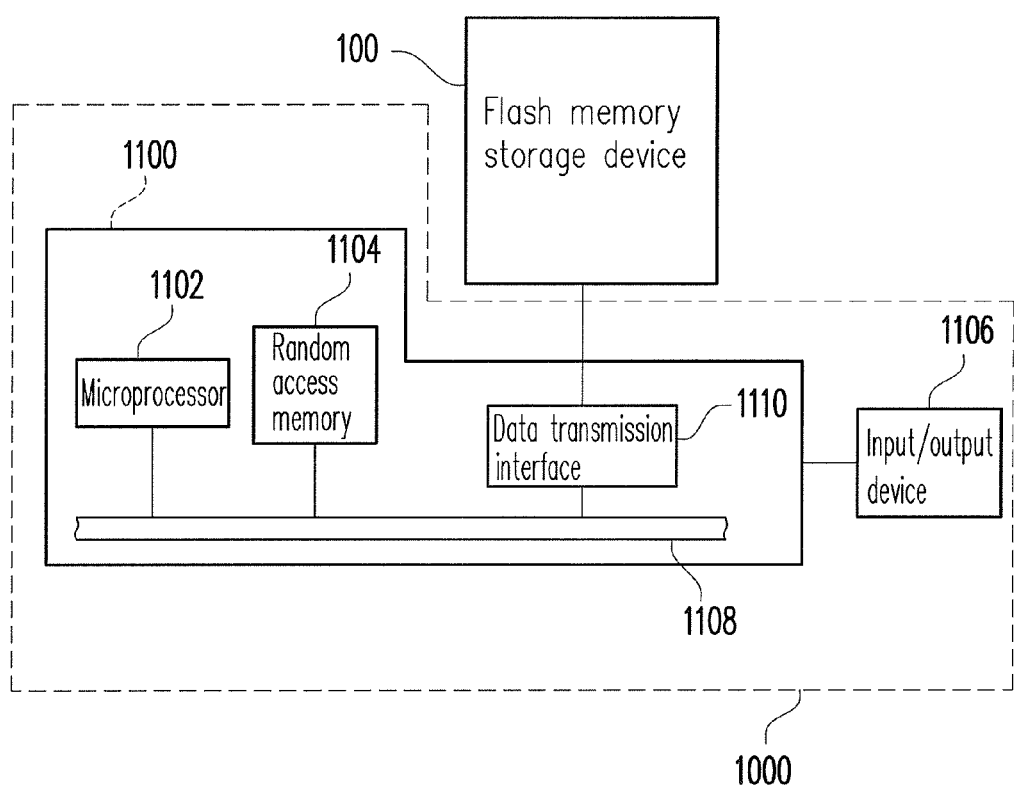
FIG. 1A is a schematic diagram showing a host system using a flash memory storage apparatus according to an exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A flash memory controller uses an error checking and correcting technique to ensure data stored in a flash memory chip accuracy. However, different zones in the flash memory have different reliability due to a non-uniform manufacturing process. Because more error bits may occur in a zone having a lower reliability and data stored in the zone will not be corrected, and when data is stored in the zone having a lower reliability, the situation where data having error bits can not be corrected may occur early. Accordingly, the exemplary embodiments of the present invention provide a data writing method for a flash memory, and a flash memory controller and a flash memory storage apparatus using the same, capable of reducing the effect of the non-uniform manufacturing process and prolonging the lifespan of the flash memory chip.

Figure 1B:
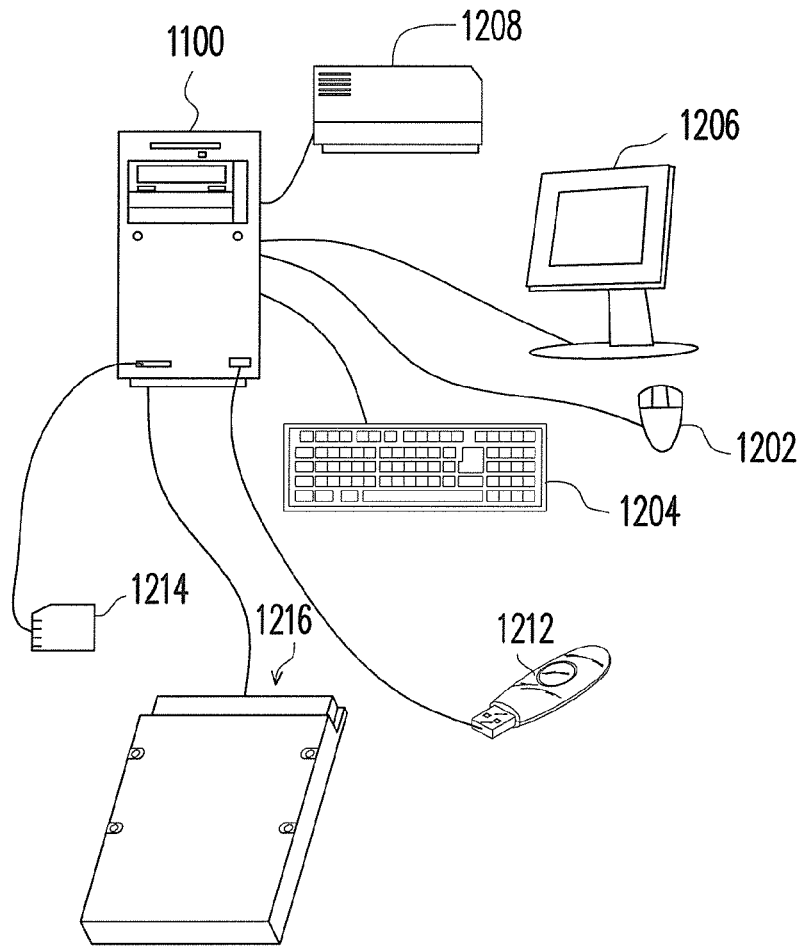
FIG. 1B is a diagram illustrating a computer, an input/output (I/O) device, and a flash memory storage apparatus according to an exemplary embodiment of the present invention.
Figure 1C:
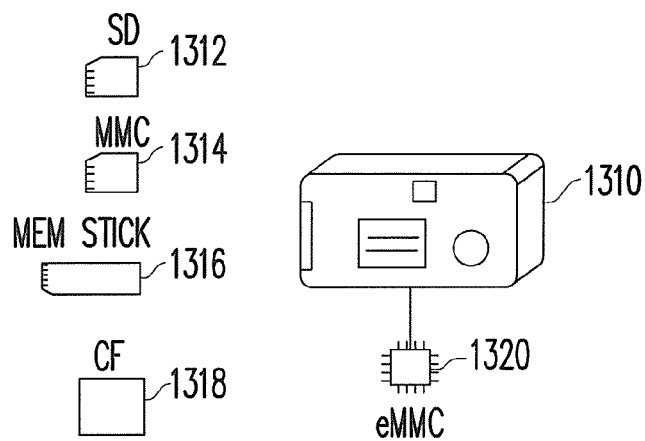
FIG. 1C is a diagram illustrating a host system and a flash memory storage apparatus according to another exemplary embodiment of the present invention.

FIG. 1A is a schematic diagram showing a host system using a flash memory storage apparatus according to an exemplary embodiment of the present invention. FIG. 1B is a diagram illustrating a computer, an input/output (I/O) device, and a flash memory storage apparatus according to an exemplary embodiment of the present invention. FIG. 1C is a diagram illustrating a host system and a flash memory storage apparatus according to another exemplary embodiment of the present invention.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208, as shown in FIG. 1B. It should be understood that the devices illustrated in FIG. 1B are not intended to limit the scope of the I/O device 1106, and the I/O device 1106 may further include other devices.

In the exemplary embodiment of the present invention, the flash memory storage apparatus 100 is coupled to the devices of the host system 1000 through the data transmission interface 1110. The host system 1000 can write data into or read data from the flash memory storage apparatus 100 through the operations of the microprocessor 1102, the RAM 1104, and the I/O device 1106. The flash memory storage apparatus 100 may be a flash drive 1212, a memory card 1214, or a solid state drive (SSD) 1216, as shown in FIG. 1B.

Generally, the host system 1000 substantially can be any system capable of storing data. Even though the host system 1000 is described as a computer system in the present exemplary embodiment, in another exemplary embodiment of the invention, the host system 1000 may also be a digital camera, a video camera, a communication device, an audio player, or a video player, and etc. For example, if the host system 1000 is a digital camera 1310, the flash memory storage apparatus 100 is then a SD card 1312, a MMC card 1314, a memory stick 1316, a CF card 1318, or an embedded storage device 1320 used in the digital camera 1310 (as shown in FIG. 1C) The embedded storage device 1320 includes an embedded MMC (eMMC). It should be mentioned that the eMMC is directly coupled to a substrate of the host system 1000.

Figure 2:
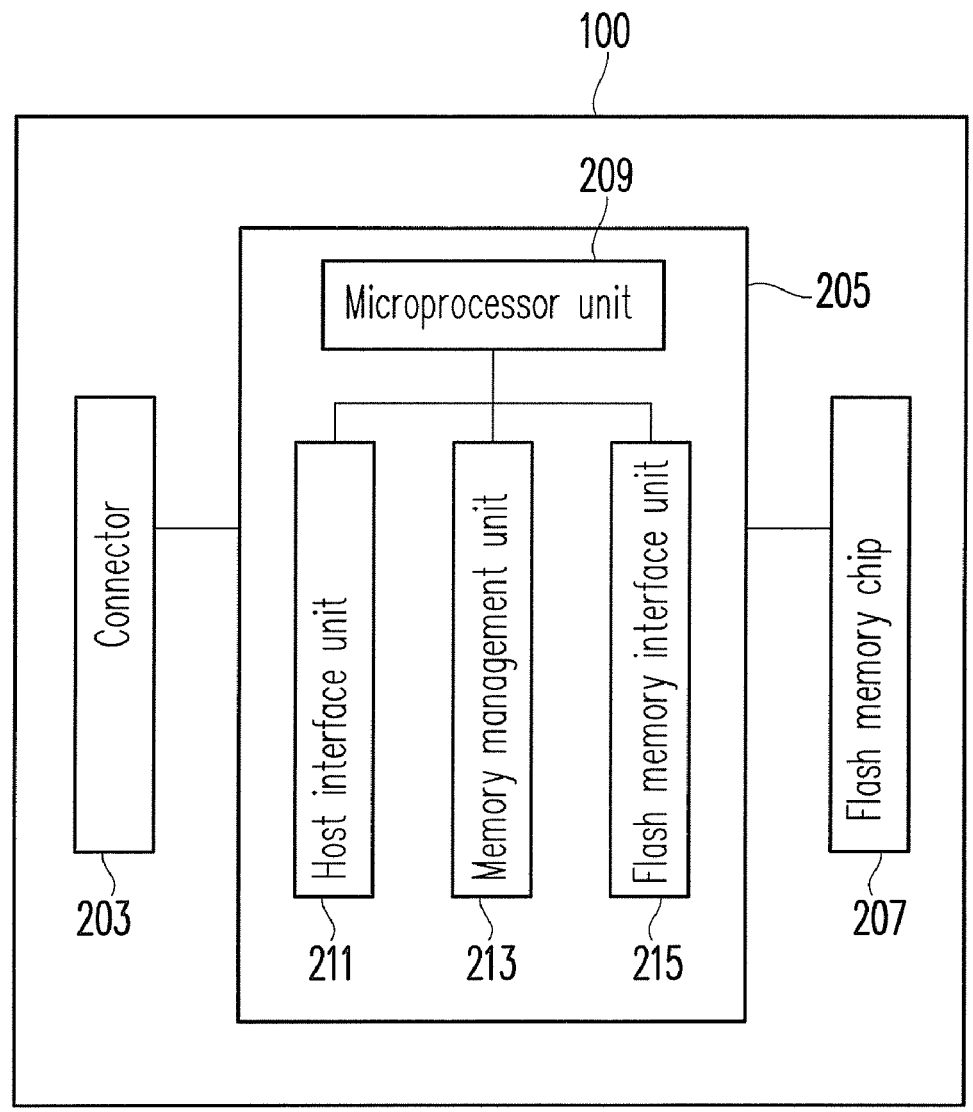
FIG. 2 is a schematic block diagram illustrating a flash memory storage apparatus according to an exemplary embodiment of the present invention.

FIG. 2 is a schematic block diagram illustrating a flash memory storage apparatus according to an exemplary embodiment of the present invention. Referring to FIG. 2, the flash memory storage apparatus 100 includes a connector 203, a flash memory controller 205, and a flash memory chip 207. The flash memory controller 205 is coupled between the connector 203 and the flash memory chip 207, and the flash memory controller 205 is coupled to the host system 1000 via the connector 203 for writing data from the host system 1000 into the flash memory chip 207.

Herein, the connector 203 is a SD connector. However, the invention is not limited thereto, and the connector 203 may also be a serial advanced technology attachment (SATA) connector, a universal serial bus (USB) connector, an Institute of Electrical and Electronic Engineers (IEEE) 1394 connector, a peripheral component interconnect (PCI) express connector, a memory stick (MS) interface connector, a multi media card (MMC) interface connector, a compact flash (CF) interface connector, an integrated device electronics (IDE) connector, or other suitable connectors.

For example, the flash memory chip 207 is a multi-level cell (MLC) NAND flash memory. Nevertheless, it should be understood that the present invention is not limited thereto. In another exemplary embodiment of the present invention, a single level cell (SLC) NAND flash memory may also be applied to the present invention.

In the exemplary embodiment, the flash memory controller 205 includes a microprocessor unit 209, a host interface unit 211, a memory management unit 213 and a flash memory interface unit 215. The host interface unit 211, the memory management unit 213 and the flash memory interface unit 215 are respectively coupled to the microprocessor unit 209.

The microprocessor unit 209 is configured to control the overall operation of the flash memory controller 205. That is, the operation of all of the components within the flash memory controller 205 is controlled by the microprocessor unit 209 directly or indirectly.

The host interface unit 211 is coupled to the microprocessor unit 209 for receiving and identifying commands transmitted by the host system 1000. Namely, the commands and data from the host system 1000 are transmitted to the microprocessor unit 209 through the connector 203 and the host interface unit 211. In the exemplary embodiment, the host interface unit 211 is a SD interface. However, it should be noticed that the present invention is not limited thereto, and the host interface unit 211 may also be a SATA interface, a USB interface, an IEEE 1394 interface, a PCI Express interface, an MS interface, an MMC interface, a CF interface, an IDE interface, or other suitable types of interfaces for data transmission.

The flash memory interface unit 215 is coupled to the microprocessor unit 209 and configured for accessing the flash memory chip 207. Namely, data to be written into the flash memory chip 207 is converted by the flash memory interface unit 215 into a format acceptable to the flash memory chip 207.

The memory management unit 213 is coupled to the microprocessor unit 209 and is configured to perform a data writing mechanism according to the exemplary embodiment. In the exemplary embodiment, the memory management unit 213 is implemented in the flash memory controller 205 in a firmware form. For example, the memory management unit 213 including a plurality of control instructions is burned into a program memory (for example, a read only memory (ROM)), and the program memory is embedded into the flash memory controller 213. When the flash memory storage apparatus 100 is in operation, the control instructions of the memory management unit 213 are executed by the microprocessor unit 209 to accomplish the data writing mechanism according to the exemplary embodiment.

In another exemplary embodiment of the present invention, the control commands of the memory management unit 213 may also be stored in a specific area (for example, a system area, which is used for storing system data, in the flash memory) of the flash memory chip 207 as program codes. Similarly, the control commands of the memory management unit 213 are executed by the microprocessor unit 209 when the flash memory storage apparatus 100 is in operation. Moreover, in another exemplary embodiment of the present invention, the memory management unit 213 may also be implemented in the flash memory controller 205 in a hardware form.

Figure 3:
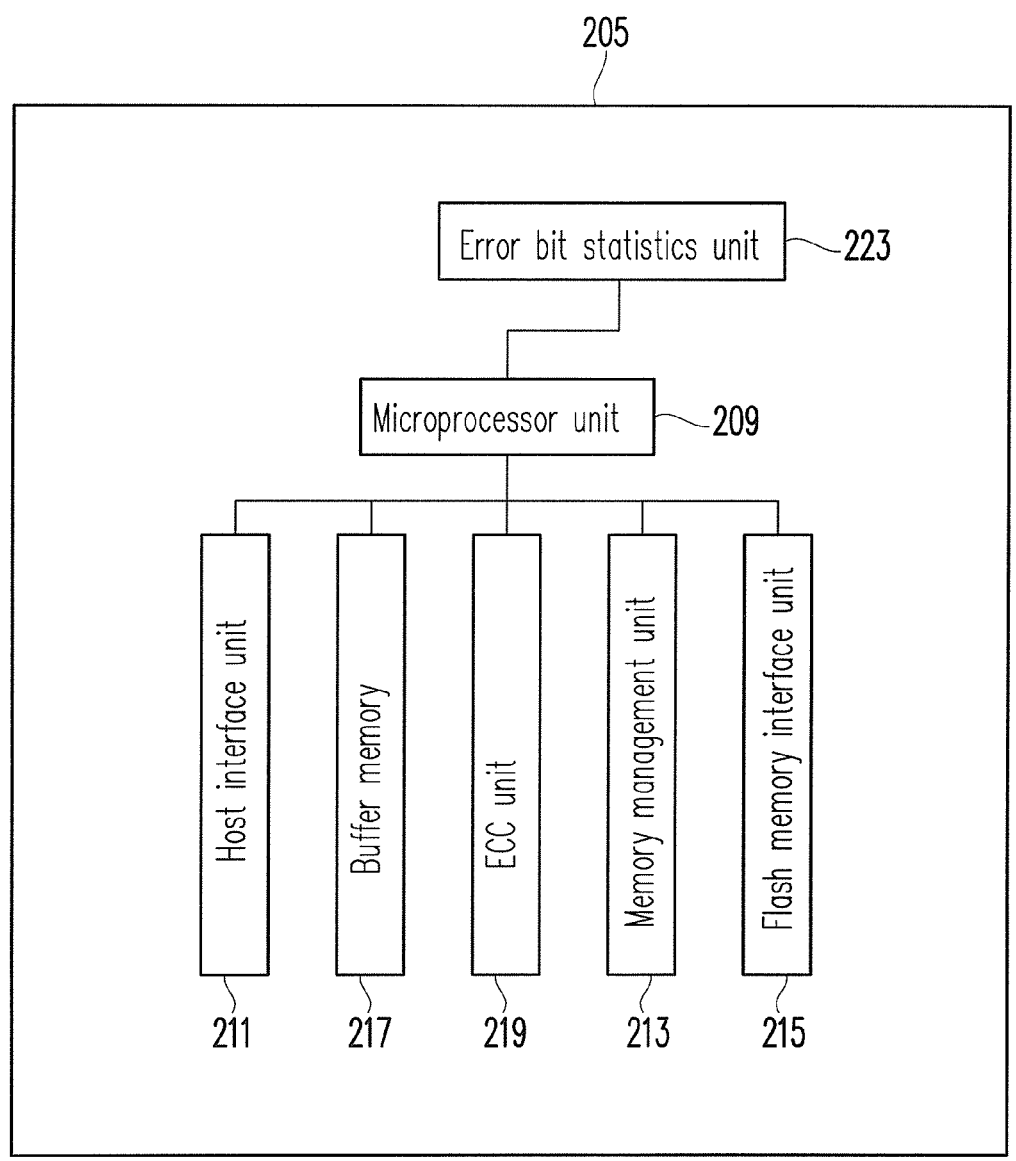
FIG. 3 is a schematic block diagram of a flash memory controller according to another exemplary embodiment of the present invention.

In another exemplary embodiment of the present invention, the flash memory controller further includes other functional modules. FIG. 3 is a schematic block diagram of a flash memory controller according to another exemplary embodiment of the present invention. Referring to FIG. 3, besides the microprocessor unit 209, the memory management unit 213, the host interface unit 211 and the flash memory interface unit 215, the flash memory controller 205 further includes buffer memory 217 and an error checking and correcting (ECC) unit 219.

The ECC unit 219 is coupled to the microprocessor unit 209, and configured for executing an error checking and correcting procedure to ensure data accuracy. To be specific, when the memory management unit 213 receives a write command from the host system 1000, the ECC unit 219 generates an ECC code for the data corresponding to the write command, and the memory management unit 213 writes the data and the corresponding ECC code into the flash memory chip 207. Subsequently, when the memory management unit 213 reads the data from the flash memory chip 207, the memory management unit 213 simultaneously reads the corresponding ECC code, and the ECC unit 219 executes the ECC procedure on the data according to the ECC code.

Herein, when the flash memory controller 205 receives data, the memory management unit 213 divides the data into a plurality of frames, and the ECC unit 219 generates ECC codes corresponding to the frames, respectively. And, the memory management unit 213 encodes the frames and the ECC codes corresponding the frames to form ECC frames, respectively. Herein, the size of the ECC frame is determined according to the size of a transmission unit, and the transmission unit is determined based on a specification of the flash memory chip. That is, the size of the ECC frame is the number of bits needed to protect in each transmission unit. For example, if the size of each transmission unit is 1 kilobytes and the number of bits needed to protect is 24 in each transmission unit, the flash memory controller 205 divides data into a plurality of frames each being 1 kilobytes. And, the ECC unit 219 generates ECC codes for the frames each being 1 kilobytes. Accordingly, each ECC frame is 1 kilobytes. But the present invention is not limited to this, each ECC frame may be 512 bytes or 2 kilobytes.

Then, the memory management unit 213 divides the ECC frames into a plurality of frame segments, ranks the frame segments in a non-sequentially ranking order and writes the ranked frame segments into the flash memory chip 207.

The buffer memory 217 is coupled to the microprocessor unit 209 and configured to temporarily store data and commands from the host system 1000 or data from the flash memory chip 207. Herein, the buffer memory 217 further is configured for temporarily storing the frame segments, such that the memory management unit 213 extracts the frame segments one by one from the buffer memory 217 according to the non-sequentially ranking order, ranks the frame segments and writes the ranked frame segments into the flash memory chip 207.

In the exemplary embodiment, the flash memory controller 205 further includes an error bit statistics unit 223. The error bit statistics unit 223 is configured for recording the number of error bits in each zone of the flash memory chip and sorting the zones of the flash memory chip 207 according to the number of error bits in each zone. Then, the non-sequentially ranking order of the frame segments is updated in a ranking order table.

It should be noted that in another embodiment of the present invention, the ECC unit 219 and the error bit statistics unit 223 may be configured in the flash memory storage apparatus 100 and coupled to the flash memory controller 205, respectively.

Detail steps of the data writing method will be described with the flash memory storage apparatus 100 as follows.

Figure 4:
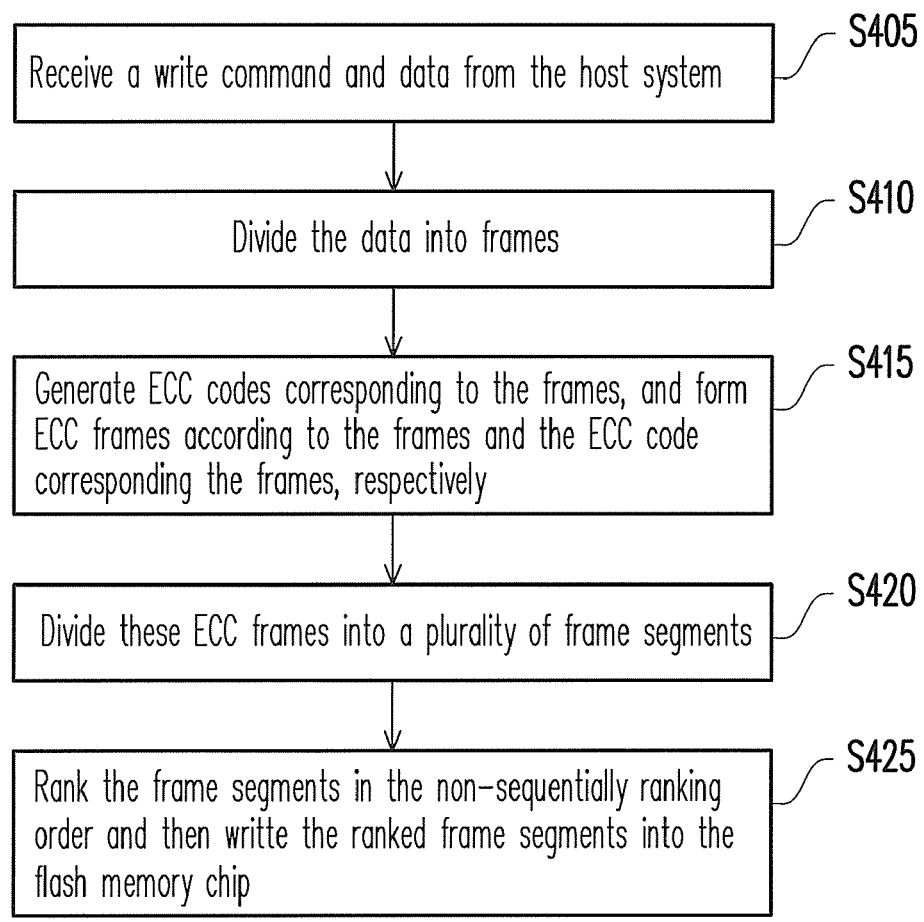
FIG. 4 is a flowchart illustrating the data writing method according to an exemplary embodiment of the present invention.

FIG. 4 is a flowchart illustrating the data writing method according to one exemplary embodiment of the present invention. Referring to FIGS. 2-4, first, in step S405, a write command and data is received from the host system 1000. To be specific, the flash memory controller 205 receives the write command and data via the host interface unit 211.

Then, in step S410, the data is divided into at least one frame. And, in step S415, an ECC code is generated corresponding to the frame, and an ECC frame is formed according to the frame and the ECC code. Referring to FIGS. 2 and 3, the ECC unit 219 generates the ECC code for the frame to form an ECC frames. In details, when the flash memory storage apparatus 100 receives data, the memory management unit 213 divides the data into a plurality of frames based on the transmission unit, and the ECC unit 219 generates ECC codes corresponding to the frames, respectively. And, the memory management unit 213 forms ECC frames according to the frames and the ECC codes corresponding frames, respectively. That is, a plurality of ECC frames are formed corresponding to the data, and each of the ECC frames has one corresponding ECC code.

After that, in step S420, these ECC frames are divided in a plurality of frame segments. That is, the memory management unit 213 of the flash memory controller 205 divides these ECC frames into a plurality of frame segments and temporarily stores these frame segments in the buffer memory 217.

For example, it is assumed that one page is used for a unit of accessing data in the flash memory chip 207, one page is 8 kilobytes, and accessing to one word line once represents accessing to one page. If the transmission unit is 0.5 kilobytes, the memory management unit 213 divides one page into 16 ECC frames and divides each ECC frame into 16 frame segments each having the same size. However, the number of divided frame segments is not limited thereto, and each ECC frame may be divided into 32 or 64 frame segments each having the same size.

Finally, in step S425, the frame segments are ranked in the non-sequentially ranking order and then written into the flash memory chip 207. In details, the memory management unit 213 of the flash memory controller 205 ranks the frame segments in the non-sequentially ranking order and then writes the ranked frame segments into the flash memory chip 207. That is to say, the memory management unit 213 extracts the frame segments from the buffer memory 217 according to the non-sequentially ranking order recorded in the ranking order table, and then writes the frame segments into the flash memory chip 207. Accordingly, the flash memory controller 205 is capable of dispersedly writing each ECC frame into the same word line.

Figure 5:
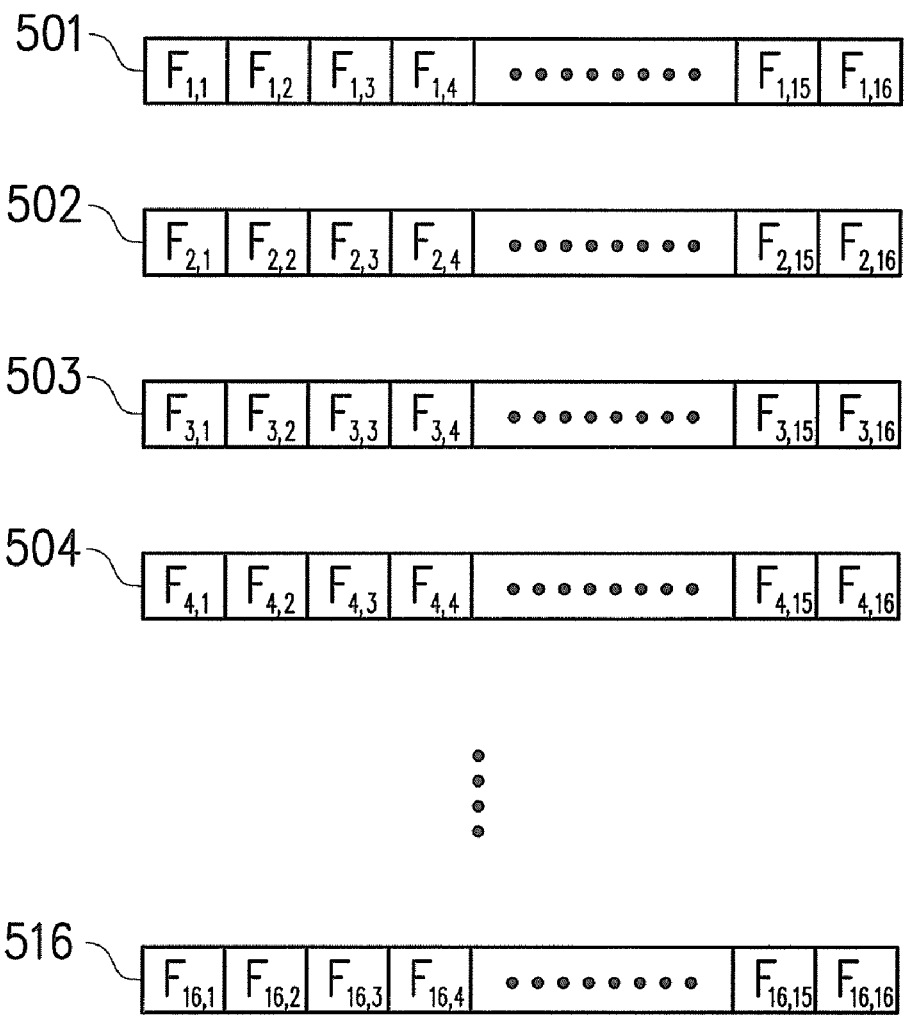
FIG. 5 is a diagram of dividing ECC frame according to an exemplary embodiment of the present invention.

For example, FIG. 5 is a diagram of dividing ECC frame according to an exemplary embodiment of the present invention. In this exemplary embodiment, it is assumed there are 16 ECC frames 501~516, and each of the ECC frames is divided into 16 frame segments each having the same size. Additionally, it is assumed that first frame segment of each of the ECC frames is first ranked, and then second frame segment of each of the ECC frames is ranked in the non-sequentially ranking order. This rule is repeated until one word line has been full with frame segments, and then the ranked frame segments are written into the flash memory chip 207.

In details, the first frame segment ($F_{1,1}$) of the first ECC frame 501 is extracted first, and then first frame segments ($F_{2,1}$, $F_{3,1}$, $F_{4,1}$, . . . , $F_{16,1}$) of other ECC frames are orderly extracted, respectively. Next, second frame segments ($F_{1,2}$, $F_{2,2}$, $F_{3,2}$, $F_{4,2}$, . . . , $F_{16,2}$) of the ECC frames are orderly extracted, respectively. Further, third frame segments ($F_{1,3}$, $F_{2,3}$, $F_{3,3}$, $F_{4,3}$, . . . , $F_{16,3}$) of the ECC frames are orderly extracted, respectively. By the same token, the extracting is repeated until the amount of the ranked frame segments is equal to the capacity of one word line, and the ranked frame segments are written into the flash memory chip 207. However, it is noted that the non-sequentially ranking order of the present invention is not limited thereto.

Additionally, the flash memory chip 207 has a plurality of word lines, and each of the word lines has a plurality of memory cells. Accordingly, the frame segments are stored in these word lines. It should be mentioned that the number of error bits in each zone in each of the word lines of the flash memory chip 207 further is recorded by the error bit statistics unit 223 of the flash memory controller 205. The number of error bits may be a sum of each frame segment in all the word lines or may be an average value of each frame segment in all the word lines. Then, the error bit statistics unit 223 determines a non-sequentially ranking order of writing the frame segments into the flash memory chip 207 according to the numbers of error bits, and updates the non-sequentially ranking order in the ranking order table as a basis for reading the ECC frames from the flash memory chip 207. The above-mentioned non-sequentially ranking order determines which frame segment is ranked first. For example, these zones are ranked based on the numbers of error bits from the largest to the smallest. That is, the zone having the largest number of error bits is ranked first, and then the zone having the next larger number of error bits is ranked, and so on. And, the error bit statistics unit 223 updates the non-sequentially ranking order in the ranking order table. Accordingly, when a data writing procedure is performed, the flash memory controller 205 writes data into the flash memory chip 207 according to the non-sequentially ranking order in the ranking order table.

For example, FIG. 6 is a diagram illustrating ECC frames and a word line according to an exemplary embodiment of the present invention. Referring to FIG. 6, taking 3 ECC frames 601, 603 and 605 as an example, and it is assumed that the maximum number of error correcting bits for each ECC frame is 16. For the convenience of description, the ECC frames 601, 603 and 605 are divided into 3 frame segments (i.e., frame segments S01, S02, S03, S11, S12, S13, S21, S22, S23), respectively. And, a word line 610 in the flash memory chip 207 is divided in 9 zones (i.e., zones F1~F9).

A relationship between the number of error bits in each of the zones of the word line 610 and the non-sequentially ranking order of the frame segments is described with an example.

FIG. 7 is a diagram illustrating word line zones and the number of error bits according to an exemplary embodiment of the present invention. FIG. 8 is a diagram illustrating a ranking order table for word line zones according to an exemplary embodiment of the present invention. In the exemplary embodiment, after the frame segments are written into a word line, the frame segments is read to record the number of error bits in each of the zones of the word line. Accordingly, an order obtained by ranking the word line zones according to the numbers of error bits in the word line zones is "F1, F2, F9, F8, F3, F7, F6, F4, F5", wherein the zone F1 has 10 error bits, the zone F2 has 9 error bits, the zone F9 has 8 error bits, the zone F8 has 4 error bits, the zone F3 has 3 error bits, the zone F7 has 2 error bits, the zone F6 has 1 error bit, the zone F4 has no error bit and the zone F5 has no error bit. However, it is noted that the non-sequentially ranking order of the present invention is not limited thereto. In another exemplary embodiment of the present invention, these zones also can be ranked based on the numbers of error bits from the smallest to the largest. Therefore, when subsequent data is about to been written into the flash memory chip, the frame segments are ranked according to the numbers of error bits and thus written into the flash memory chip 207 based on the non-sequentially ranking order. For example, referring to FIG. 8, the first frame segments S01, S11 and S21 of the ECC frames respectively are corresponded to the word line zones F1, F2 and F9, the second frame segments S02, S12 and S22 of the ECC frames respectively are corresponded to the word line zones F8, F3 and F7, and the third frame segments S03, S13 and S23 of the ECC frames respectively are corresponded to the word line zone F6, F4, and F5. Accordingly, the non-sequentially ranking order of the frame segments is "S01, S11, S12, S13, S23, S03, S22, S02, S21".

It should be noted that the maximum number of error correcting bits of each ECC frame is 16, therefore whether a sum of the numbers of error bits in the zones used for storing the frame segments belonging to the same ECC frame is larger than 16 must be considered. Detailed explanations with another example are given below.

FIG. 9 is a diagram illustrating the numbers of error bits of word line zones according to another exemplary embodiment of the present invention. FIG. 10 is a diagram illustrating a ranking order table according to another exemplary embodiment of the present invention. In this example, an order obtained by ranking the word line zones according to the numbers of error bits in the word line zones is "F1, F2, F9, F3, F4, F8, F7, F6, F5". When a non-sequentially ranking order of the frame segments is determined according to the foregoing order, the first frame segments S01, S11 and S21 of the ECC frames are respectively written into the word line zones F1, F2 and F9, the second frame segments S02, S12 and S22 of the ECC frames are respectively written into the word line zones F3, F4 and F8, and the third frame segments S03, S13 and S23 of the ECC frames are respectively written into the word line zones F7, F6 and F5. Herein, a sum of the numbers of error bits in the zones used for writing the frame segments belonging to the same ECC frame must be not larger than 16. Taking the ECC frame 601 as an example, a sum of the numbers of error bits in the frame segments S01, S02 and S03 must be smaller than 16 or equal to 16. Similar, the ECC frame 603 and the ECC frame 605 also be considered by the parity of reasoning. However, based on the foregoing order, the sum of the numbers of error bits (i.e., F1, F3 and F7) of the frame segments S01, S02 and S03 is larger than 16 (the sum of the numbers of error bits of the frame segments S01, S02 and S03 is 18 (=10+6+2)). Accordingly, the non-sequentially ranking order of the frame segments must be adjusted.

For example, the first frame segments S01, S11 and S21 in the ECC frames are corresponded to the word line zones F1, F2 and F9, wherein the number of error bits of the word line zones F1 is larger than that of the word line zone F2 and the number of error bits of the word line zones F2 is larger than that of the word line zone F9. Next, the second frame segments S02, S12 and S22 in the ECC frames are corresponded to the word line zones F8, F4 and F3, wherein the number of error bits of the word line zone F8 is smaller than that of the word lines F4 and the number of error bits of the word line zone F4 is smaller than that of the word line zone F3. After that, the third frame segments S03, S13 and S23 in the ECC frames are corresponded to the word line zones F7, F6 and F5, wherein the number of error bits of the word line zone F7 is larger than that of the word line zone F6 and the number of error bits of the word line zones F6 is larger than that of the word line zone F5. Accordingly, the sum of the numbers of error bits corresponding to the ECC frame 601 is 16 (=10+4+2), the sum of the numbers of error bits corresponding to the ECC frame 603 is 15 (=9+5+1), and the sum of the numbers of error bits corresponding to the ECC frame 605 is 14 (=8+6+0).

Additionally, in another exemplary embodiment, the foregoing non-sequentially ranking order may be adjusted in any suitable method, such that the sum of the numbers of error bits corresponding to the ECC frame 601, the sum of the numbers of error bits corresponding to the ECC frame 603, and the sum of the numbers of error bits corresponding to the ECC frame 605 are smaller than or equal to 16. Detailed explanations with another exemplary embodiment are given below. FIG. 11 is a diagram illustrating a ranking order table according to another exemplary embodiment of the present invention. After adjusting, the sums of the numbers of error bits corresponding the ECC frames are 16, 16 and 13, respectively. However, the present invention is not limited herein. Any ranking method which is capable of making the numbers of error bits corresponding to the ECC frames are not larger than the error correcting capability (e.g., 16 bits) is within the scope or spirit of the invention.

Subsequently, when the flash memory controller 205 is about to read a ECC frame, the frame segments belonging to the same ECC frame are read according to the ranking order table and thus restored.

In summary, in the exemplary embodiments, data are divided and encoded to form a plurality of ECC frames, each of the ECC frames is divided into a plurality of frame segments, the frame segments are written in to the flash memory chip in a non-sequentially ranking order. Each of the ECC frames dispersedly is written into different zones, but not written into adjacent addresses, therefore the situation where data having error bits can not be corrected when one ECC frame is damaged may be prevented. Accordingly, the effect of the non-uniform manufacturing process is eliminated and the lifespan of the flash memory storage apparatus is prolonged. The previously described exemplary embodiments of the present invention have the advantages aforementioned, wherein the advantages aforementioned not required in all versions of the invention.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A data writing method, for writing data from a host system into a flash memory chip, the data writing method comprising:
receiving data from a host system;
dividing the data into at least one frame;
generating an error checking and correcting (ECC) code corresponding to the at least one frame and forming at least one ECC frame according to the at least one frame and the ECC code;
dividing the at least one ECC frame into a plurality of frame segments;
dividing each of a plurality of word lines of the flash memory chip into a plurality of zones;
determining a non-sequentially ranking order for writing the frame segments into the word lines according to the number of error bits of each of the zones; and
ranking the frame segments in the non-sequentially ranking order and writing the ranked frame segments into the flash memory chip.

2. The data writing method according to claim 1 further comprising: temporarily storing the frame segments in a buffer memory after the step of dividing the at least one ECC frame into the frame segments.

3. The data writing method according to claim 2, wherein the step of ranking the frame segments in the non-sequentially ranking order and writing the ranked frame segments into the flash memory chip comprises:
extracting each of the frame segments from the buffer memory according to the non-sequentially ranking order, and writing the frame segments into the flash memory chip after the frames segments are ranked.

4. The data writing method according to claim 1 further comprising:
establishing a ranking order table to record the non-sequentially ranking order.

5. The data writing method according to claim 4, wherein each of the word lines has a plurality of memory cells, the data writing method further comprises:
recording the number of error bits in each zone in each of the word lines of the flash memory chip for determining the non-sequentially ranking order, and
updating the non-sequentially ranking order in the ranking order table;
wherein, the step of recording the number of error bits in each zone in each of the word lines of the flash memory chip comprises:
storing the frame segments in the word lines; and
reading the frame segments to record the number of error bits in each of the zones in the word lines.

6. The data writing method according to claim 1, wherein the step of determining the non-sequentially ranking order for writing the frame segments into the word lines according to the number of error bits of the zones comprises:
determining the non-sequentially ranking order for writing the frame segments into the word lines based on the number of error bits in each of the zones from the largest to the smallest or from the smallest to the largest.

7. The data writing method according to claim 6, wherein the step of determining the non-sequentially ranking order for writing the frame segments into the word lines based on the number of error bits in each of the zones from the largest to the smallest or from the smallest to the largest comprises:
determining the non-sequentially ranking order of the frame segments according to the maximum number of error correcting bits of the at least one ECC frame, wherein a sum of the number of error bits in the zones that the frame segments of the at least one ECC frame are written into is smaller than or equal to the maximum number of error correcting bits.

8. The data writing method according to claim 1, wherein the non-sequentially ranking order comprises:
ranking a first frame segment of the at least one ECC frame, and ranking a next frame segment of the at least one ECC frame until all the frame segments of the at least one ECC frame have been ranked.

9. A flash memory controller, for writing data from a host system into a flash memory chip, the flash memory controller comprising:
a microprocessor unit;
a flash memory interface unit, coupled to the microprocessor unit, and configured to couple to the flash memory chip;
a host interface unit, coupled to the microprocessor unit and configured to couple to the host system and receive the data from the host system;
a memory management unit, coupled to the microprocessor unit and configured to write the data into the flash memory chip;
an error checking and correcting (ECC) unit, coupled to the microprocessor unit and configured to generating an ECC code for the data, wherein the memory management unit divides the data into at least one frame, the ECC unit generates an ECC code corresponding to the at least one frame, the memory management unit forms at least one ECC frame according to the at least one frame and the ECC code corresponding to the at least one frame, and the memory management unit divides the at least one ECC frame into a plurality of frame segments, ranks the frame segments in a non-sequentially ranking order and writes the ranked frame segments into the flash memory chip; and
an error bit statistics unit, configured to determine a non-sequentially ranking order, wherein the memory management unit dividing each of a plurality of word lines of the flash memory chip into a plurality of zones, and the error bit statistics unit determines the non-sequentially ranking order for writing the frame segments into the word lines according to the number of error bits of each of the zones.

10. The flash memory controller according to claim 9 further comprising:
a buffer memory, coupled to microprocessor unit and configured to temporarily store the frame segments.

11. The flash memory controller according to claim 10, wherein the memory management unit extracts each of the frame segments from the buffer memory according to the non-sequentially ranking order, and writes the frame segments into the flash memory chip after the frames segments are ranked.

12. The flash memory controller according to claim 9, wherein the memory management unit ranks a first frame segment of the at least one ECC frame, and ranks a next frame segment of the at least one ECC frame until all the frame segments of the at least one ECC frame have been ranked.

13. The flash memory controller according to claim 9, wherein the memory management unit records the non-sequentially ranking order in a ranking order table.

14. The flash memory controller according to claim 13, wherein each of the word lines has a plurality of memory cells and the frame segments are stored in the word lines,
the error bit statistics unit is further configured to read the frame segments to record the number of error bits of each of the zones in the word lines,
wherein the memory management unit updates the non-sequentially ranking order in the ranking order table.

15. The flash memory controller according to claim 9, wherein the error bit statistics unit determines the non-sequentially ranking order for writing the frame segments into the word lines based on the number of error bits in each of the zones from the largest to the smallest or from the smallest to the largest.

16. The flash memory controller according to claim 15, wherein the error bit statistics unit determines the non-sequentially ranking order of the frame segments according to the maximum number of error correcting bits of the at least one ECC frame, wherein a sum of the number of error bits in the zones that the frame segments of the at least one ECC frame are written into is smaller than or equal to the maximum number of error correcting bits.

17. A flash memory storage apparatus, for storing data from a host system, the flash memory storage apparatus comprising:
a connector, coupled to the host system and configured to receive the data from the host system;
a flash memory chip; and
a flash memory controller, coupled to the flash memory chip and the connector and configured to divide the data into at least one frame, generate an ECC code corresponding to the at least one frame, form at least one ECC frame according to the at least one frame and the ECC code, divide the at least one ECC frame into a plurality of frame segments, rank the frame segments in a non-sequentially ranking order and write the ranked frame segments into the flash memory chip, and configured to divide each of a plurality of word lines of the flash memory chip into a plurality of zones, the flash memory controller comprises:
an error bit statistics unit, configured to determine the non-sequentially ranking order for writing the frame segments into the word lines according to the number of error bits of each of the zones.

18. The flash memory storage apparatus according to claim 17 further comprising:
a buffer memory, configured to store the frame segments temporarily.

19. The flash memory storage apparatus according to claim 18, wherein the flash memory controller extracts each of the frame segments from the buffer memory according to the non-sequentially ranking order, and writes the frame segments into the flash memory chip after the frames segments are ranked.

20. The flash memory storage apparatus according to claim 17, wherein the flash memory controller ranks a first frame segment of the at least one ECC frame, and ranks a next frame segment of the at least one ECC frame until all the frame segments of the at least one ECC frame have been ranked.

21. The flash memory storage apparatus according to claim 17, wherein the flash memory controller records the non-sequentially ranking order in a ranking order table.

22. The flash memory storage apparatus to claim 21, wherein each of the word lines has a plurality of memory cells and the frame segments are stored in the word lines,
the error bit statistics unit is further configured to read the frame segments to record the number of error bits of each of the zones in the word lines, wherein the memory management unit updates the non-sequentially ranking order into the ranking order table.

23. The flash memory storage apparatus according to claim 22, wherein the error bit statistics unit determines the non-sequentially ranking order for writing the frame segments into the word lines based on the number of error bits in each of the zones from the largest to the smallest or from the smallest to the largest.

24. The flash memory storage apparatus according to claim 23, wherein the error bit statistics unit determines the non-sequentially ranking order of the frame segments according to the maximum number of error correcting bits of the at least one ECC frame, wherein a sum of the number of error bits in the zones that the frame segments of the at least one ECC frame are written into is smaller than or equal to the maximum number of error correcting bits.

25. The data writing method according to claim 1, wherein each ECC frame is stored in one of the word lines.

26. The flash memory storage apparatus according to claim 17, wherein each ECC frame is stored in one of the word lines.

* * * * *